United States Patent [19]

Varanasi et al.

[11] Patent Number: 6,140,015
[45] Date of Patent: Oct. 31, 2000

[54] PHOTORESIST COMPOSITIONS WITH PENDANT POLAR-FUNCTIONALIZED AROMATIC GROUPS AND ACID-LABILE BRANCHING

[75] Inventors: Pushkara R. Varanasi; Ahmad D. Katnani; Mahmoud M. Khojasteh, all of Poughkeepsie; Ranee W. Kwong, Wappingers Falls, all of N.Y.

[73] Assignee: International Business Machines Corporation, Armonk, N.Y.

[21] Appl. No.: 09/209,019

[22] Filed: Dec. 10, 1998

[51] Int. Cl.[7] .............................. G03C 1/73; G03F 7/028
[52] U.S. Cl. ..................................... 430/281.1; 430/270.1
[58] Field of Search .............................. 430/270.1, 281.1, 430/285.1, 927, 905

[56] References Cited

U.S. PATENT DOCUMENTS

| | | | |
|---|---|---|---|
| 3,917,483 | 11/1975 | Limburg | 96/27 |
| 3,923,514 | 12/1975 | Marsh | 96/35 |
| 4,356,252 | 10/1982 | Lee | 430/270 |
| 4,435,496 | 3/1984 | Walls et al. | 430/285 |
| 4,855,017 | 8/1989 | Douglas | 156/643 |
| 4,889,948 | 12/1989 | Mathias et al. | 560/181 |
| 5,213,875 | 5/1993 | Su et al. | 428/209 |
| 5,306,809 | 4/1994 | Boon et al. | 530/363 |
| 5,362,663 | 11/1994 | Bronner et al. | 437/52 |
| 5,429,710 | 7/1995 | Akiba et al. | 216/17 |
| 5,505,931 | 4/1996 | Pribish | 424/1.11 |
| 5,562,801 | 10/1996 | Nulty | 156/643.1 |
| 5,618,751 | 4/1997 | Golden et al. | 438/392 |
| 5,712,078 | 1/1998 | Huang et al. | 430/270.1 |
| 5,714,559 | 2/1998 | Schacht et al. | 526/313 |
| 5,744,376 | 4/1998 | Chan et al. | 437/190 |
| 5,801,094 | 9/1998 | Yew et al. | 438/624 |
| 5,821,469 | 10/1998 | Shanmugham | 174/135 |
| 5,851,728 | 12/1998 | Kim et al. | 430/270.1 |
| 5,962,186 | 10/1999 | Park et al. | 430/270.1 |
| 5,994,022 | 11/1999 | Tanabe et al. | 430/170 |

FOREIGN PATENT DOCUMENTS

| | | | |
|---|---|---|---|
| 0 422 628 A2 | 4/1991 | European Pat. Off. | G03F 7/039 |
| 0 738 744 A2 | 10/1996 | European Pat. Off. | C08G 65/34 |

*Primary Examiner*—Janet Baxter
*Assistant Examiner*—Yvette M Clarke
*Attorney, Agent, or Firm*—Steven Capella

[57] ABSTRACT

Acid-catalyzed positive photoresist compositions having generally improved performance (especially photoresist compositions having improved contrast (solubility differential), shrinkage and processing kinetics on radiation exposure) are obtained by use of polymers containing pendant polar-functionalized aromatic groups and acid-labile light crosslinking. The photoresist compositions also may contain a photosensitive acid-generating component as well as a solvent and possibly other auxiliary components. The polymers may contain other functional groups or components designed to impart alkaline-solubility, to provide alkaline-solubility protection in the absence of generated acid, etc.

The photoresist compositions can be used to create patterned photoresist structures and further to make conductive, semi-conductive or insulative structures by photolithography.

17 Claims, No Drawings

PHOTORESIST COMPOSITIONS WITH PENDANT POLAR-FUNCTIONALIZED AROMATIC GROUPS AND ACID-LABILE BRANCHING

BACKGROUND OF THE INVENTION

Acid-catalyzed photoresist compositions are widely used in photolithography applications, especially in the manufacture of integrated circuits and other devices where patterned photoresist layers are employed in device manufacture.

In most applications, the acid-catalyzed photoresist composition is applied to a surface where a patterned photoresist layer is desired (e.g. to the surface of a semiconductor wafer) as a liquid solution. The solvent is then typically removed to form a thin solid photoresist layer on the desired surface. In many instances, the solvent removal may be assisted by a heating step. Depending on the specific photoresist composition, heating may also be used to cause a reaction in the unexposed photoresist to improve its properties (e.g. by crosslinking). Typically, the applied photoresist layer is then patternwise exposed to radiation adapted to cause generation of acid or other property change within the exposed areas of the photoresist. The exposure is typically done through a mask containing a pattern of openings to create a corresponding pattern of exposed areas in the photoresist. In some cases, such as with the use of electron beam (e-beam) radiation, a patternwise exposure may be achieved without a mask by scanning the electron-beam over the photoresist layer in a patterned manner.

After radiation exposure, the pattern is developed or revealed by selective removal of the exposed or unexposed portions of the photoresist depending on whether the photoresist acts in a positive mode or a negative mode. Prior to selective removal, the exposed photoresist layer may be treated (e.g., by application of heat) to enhance the property differences created by the exposure. Once the exposed photoresist layer is ready for development, the selective removal is typically done by treating the photoresist layer with a solvent which selectively removes portions of the photoresist by dissolution. The patterned photoresist layer may then be used in whatever manner desired for the specific manufacturing objective.

Acid-catalyzed photoresists are generally characterized by the combination of an acid-sensitive polymer with a radiation-sensitive acid-generating compound (photosensitive acid generator or PAG). On exposure of the photoresist composition to a suitable radiation source, the PAG generates an acid of sufficient strength to cause a reaction with the acid-sensitive polymer. The reaction is typically catalytic in nature (i.e. the initial acid generated reacts with the acid-sensitive polymer to create additional acid which is available for further reaction). The acid-catalyzed reaction is often enhanced by baking the exposed photoresist composition. The reaction between the acid-sensitive polymer and the generated acid alters the characteristics of the polymer in the exposed photoresist composition relative to the same polymer in an unexposed photoresist composition such that the exposed photoresist can be selectively removed relative to the unexposed photoresist (in the case of positive photoresists).

In the case of positive photoresist compositions, the acid generated on exposure to radiation typically causes the exposed photoresist composition to exhibit increased solubility in alkaline media (and/or other property difference) compared to the unexposed photoresist. The acid-sensitive polymer typically contains acid-labile pendant groups and polar pendant groups. The polar pendant groups promote solubility of the polymer in alkaline media (e.g. an aqueous base solution) whereas some or all of the acid-labile pendant groups "protect" the polymer from solubility in alkaline media. In the unexposed polymer, the relative amounts of the polar pendant groups and the acid-labile protecting groups are preferably such that the unexposed polymer remains substantially insoluble in alkaline media. On exposure of the photoresist to suitable radiation, at least a portion of the acid-labile groups are cleaved from the polymer in response to the generated acid. This cleaving reaction shifts the balance between the polar groups and the acid-labile protecting groups such that the polymer becomes substantially soluble in alkaline media.

The nature of the acid-labile groups is important to the degree and ease of the solubility shift on radiation-induced acid generation. The ability of the polymer to undergo the shift in solubility is enhanced if the cleaving of the acid-labile groups results in formation of additional pendant polar groups on the polymer. The performance of the photoresist is also enhanced to the extent that the cleavage of the acid-labile group results in the formation of additional acid which causes cleavage of further acid-labile groups from the polymer.

The nature of the pendant polar groups on the original polymer also has a substantial impact on the performance of the photoresist. The polar groups should be of sufficient strength to impart substantial alkaline solubility when present in a sufficient proportion while they should not adversely impact the other performance aspects of the photoresist. Over the last several years, the most widely used (especially for deep UV (190–315 nm wavelength lithography) pendant polar groups have been based on imparting polar functionality to a pendant aromatic ring (e.g., of a styrene monomer) which is incorporated into the photoresist polymer. The polar functionality can be imparted on the aromatic ring of the styrene before or after incorporation of the styrene in the synthesis of the photoresist polymer. The most widely used polar-functionalized aromatic group has been hydroxystyrene, however the use of other pendant polar groups based on styrene. Polar-functionalized styrene groups also tend to provide improved performance characteristics in subsequent processing.

While the acid-catalyzed photoresist compositions available in the art provide good performance for many photolithography applications, there remains a desire for improved performance such as greater change in solubility on radiation exposure (e.g. for improved pattern contrast), reduced shrinkage of the photoresist composition on exposure and on post-exposure baking, improved kinetics of solubility change (e.g. to reduce processing time), and improved etch resistance of the patterned photoresist layer. Reduced shrinkage and improved etch resistance are especially important in the reliable production of finer sized features.

In many photolithographic applications, the desired size of feature details in the exposed pattern continues to become increasingly finer. For semiconductor applications, there is typically a desire to create patterns having resolution of details in the sub-micron range. This desire is especially strong in the manufacture of integrated circuits since the reduction of detail size generally corresponds to an increase is device density that can be constructed. Similar desires for the ability to produce fine details exist in other areas such as the manufacture of micromachines, magnetic heads, magnetic/electronic storage devices, etc.

SUMMARY OF THE INVENTION

The invention provides acid-catalyzed positive photoresist compositions having generally improved performance, and especially photoresist compositions having improved contrast (solubility differential), shrinkage and processing kinetics on radiation exposure. The invention achieves improved performance by use of polymers containing pendant polar-functionalized aromatic groups and acid-labile branching.

In one aspect, the invention encompasses photoresist compositions comprising: comprising (a) a lightly crosslinked polymer containing polar-functionalized aromatic pendant groups and having acid-labile crosslinks, and (b) a photosensitive acid generator, said lightly crosslinked polymer containing the structure:

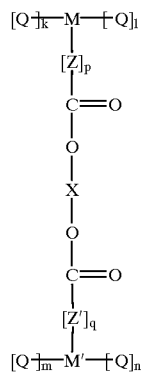

(1)

wherein:
(i) k, l, m, and n are independently equal to 0 or 1, except that $(k+l) \geq 1$ and $(m+n) \geq 1$,
(ii) X is a component that forms at least one acid-cleavable bond with an oxygen of a neighboring carboxyl moiety,
(iii) M and M' are moieties independently selected from the group consisting of an ethylene backbone moiety, a cycloalkyl moiety, and a polycyclic alkyl moiety,
(iv) Z and Z' are moieties independently selected from the group consisting of phenyl and cycloalkyl,
(v) p and q are independently equal to 0 or 1,
(vi) Q is a polymeric structure containing units having the structure:

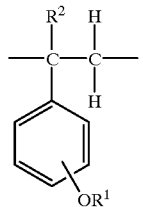

(vii) $R^1$ is selected from the group consisting of H, carboxyl, or other base-soluble moieties, and
(viii) $R^2$ is either hydrogen or an alkyl group.

For application to a substrate, the compositions may further comprise a solvent and possibly other auxiliary components. The polymers may contain other functional groups or components designed to impart alkaline-solubility, to provide alkaline-solubility protection in the absence of generated acid, etc. Preferably, the Q structures contain components containing acid labile protecting groups designed to inhibit aqueous alkaline solubility.

The invention further encompasses processes for making patterned photoresist structures using the compositions of the invention. The invention also encompasses processes for making conductive, semiconductive or insulative structures using the patterned photoresist structures containing the compositions of the invention.

These and other aspects of the invention are discussed in further detail below.

DETAILED DESCRIPTION OF THE INVENTION

The photoresist compositions of the invention are generally characterized by the presence of a polymer containing both pendant polar-functionalized aromatic groups and acid-labile crosslinking. Photoresist compositions containing polymers having these features are especially useful for forming photoresist structures using deep-UV radiation photolithography. The invention further encompasses patterned photoresist structures containing the polymers of the invention, as well as processes for creating the photoresist structures and using the photoresist structures to form conductive, semiconductive and/or insulative structures. The term lightly crosslinked is intended to indicate that the photoresist composition preferably remains soluble in at least one solvent commonly used as a vehicle for photoresist formulations.

The photoresist compositions of the invention generally comprise (a) a lightly crosslinked polymer containing polar-functionalized aromatic pendant groups and having acid-labile crosslinks, and (b) a photosensitive acid generator, the lightly crosslinked polymer containing the structure:

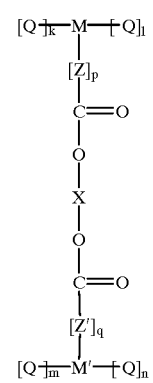

(1)

wherein:
(i) k, l, m, and n are independently equal to 0 or 1, except that $(k+l) \geq 1$ and $(m+n) \geq 1$,
(ii) X is a component that form at least one acid-cleavable bond with an oxygen of a neighboring carboxyl moiety,
(iii) M and M' are moieties independently selected from the group consisting of an ethylene backbone moiety, a cycloalkyl moiety, and a polycyclic alkyl moiety,
(iv) Z and Z' are moieties independently selected from the group consisting of phenyl and cycloalkyl,
(v) p and q are independently equal to 0 or 1,
(vi) Q is a polymeric structure containing units having the structure:

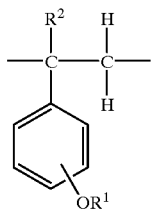

(2)

(vii) $R^1$ is selected from the group consisting of H, carboxyl, or other base-soluble moieties, and (viii) $R^2$ is either hydrogen or an alkyl group.

Where the value of k, l, m, n is zero, the lightly crosslinked polymer may contain some other group or polymer chain at that location of the structure. The lightly crosslinked polymer preferably contains a plurality of structures (1).

M and M' are moieties independently selected from the group consisting of an ethylene backbone moiety, a cycloalkyl moiety, and a polycyclic alkyl moiety. Preferred moieties are selected from the group consisting of:

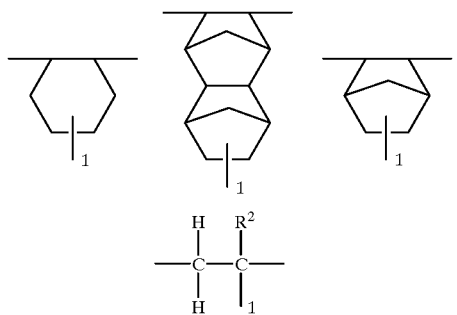

where position 1 represents a bond to a Z or Z' or a direct bond to a carboxyl crosslinking moiety.

The structures Q may be identical to or different from each other. The polar groups $OR^1$ may be selected from the group consisting of OH, carboxyl, other acidic polar groups and non-acidic polar groups, the non-acidic polar groups containing at least one atom selected from the group consisting of oxygen and nitrogen. The structure Q preferably contains a plurality of structures (2). Where the structure Q contains a plurality of structures (2), the polar groups may be the same on each aromatic ring or they may vary within the polar groups described above. The polar groups are selected and number of structures (2) present are preferably such that the resulting photoresist composition is substantially soluble in alkaline media (e.g. aqueous or non-aqueous base developing solutions). The polar groups are preferably in the para position on the respective aromatic rings.

In addition to the structures (2), the structures Q may contain other functional groups or components designed to impart further alkaline-solubility, to provide alkaline-solubility protection in the absence of generated acid, or to affect some other property of the resulting photoresist composition. Preferably, the structures Q contain additional structures selected from the group consisting of

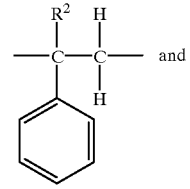

(3)

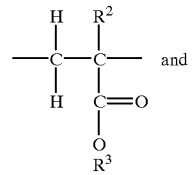

(4)

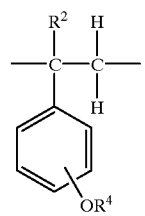

(5)

wherein $R^2$ is as defined above. The $OR^3$ ester may be acid labile or non-acid labile. $R^3$ is preferably a moiety selected from the group consisting of primary alkyl, secondary alkyl, tertiary alkyl, alicyclic, heterocyclic and heteroaromatic moieties. Where $OR^3$ is an acid labile ester group, preferred $R^3$ moieties are selected from the group consisting of tertiary alkyl and heterocyclic non-aromatic oxygen-containing rings. $OR^4$ may be acid labile or non-acid labile. $R^4$ is preferably a moiety selected from the group consisting of primary alkyl, secondary alkyl, tertiary alkyl, alicyclic, heterocyclic and heteroaromatic moieties. Where $OR^4$ is an acid labile group, preferred $OR^4$ moieties are selected from the group consisting of tertiary butyl oxycarbonate, ketal, and acetal.

Acid cleavable component O—X may vary in structure as long as the overall structure remains acid labile such that the crosslink can be broken upon exposure to the acid generated by the PAG on radiation exposure. Preferably, component O—X represents at least one an acid labile group selected from the group consisting of tertiary alkyloxy (more preferably butyloxy), ketal, and acetal. The more preferably, the acid labile group(s) represented by component O—X are such that upon reaction with the acid, further acid is generated and the remaining component on the polymer chain after cleavage itself promotes alkaline solubility. Most preferably, X is such that O—X—O represents two acid labile ester groups which are bonded together. If desired, the acid cleavable groups may be different at different linking locations in the polymer.

While component X is shown with two bonds, it is possible for component X to have a greater number of acid labile (or other) bonds (e.g., where X is a tri-functional hexane ring). Another alternative X structure could contain a core moiety (e.g., a ring structure) with one or more pendant tertiary alkyl moieties whereby the acid labile O—X bond is between the oxygen of the carboxyl moiety and the tertiary alkyl moiety of component X.

As noted above, the structures Q may themselves contain further crosslinks (6) having the structure indicated below where $R^2$, M, M', X, Z and Z' are defined as mentioned above:

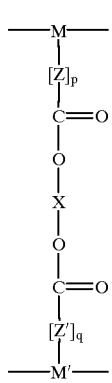

(6)

The invention is not limited to compositions having any particular proportion of the above-mentioned structures in the photoresist polymer. Preferably, the lightly crosslinked polymers used in the photoresist compositions of the invention consist predominantly of the structures (1)–(6). That is, the structures Q of structure (1) preferably comprise predominantly structures of types (2)–(6). More preferably, the structures Q consist essentially of structures of types (2)–(6). The relative amounts of (2)–(6) can be varied depending on the desired performance characteristics of the resulting photoresist composition. For example, the polar-functionalized aromatic (2) can be varied to promote solubility in the exposed photoresist; the styrene monomer (3) can be varied to influence the behavior of the photoresist in subsequent etching processes; acrylate monomer (4) can be varied both in amount and in content of acid labile ester groups to influence the change in solubility on exposure; and the crosslinking group (6) can be varied to influence the solubility/workability of the photoresist for application to the substrate as well as to influence the change in solubility on exposure of the photoresist to radiation.

For photolithographic applications used in the manufacture of integrated circuit structures and other microscopic structures, the lightly crosslinked polymers of invention preferably contain at least about 1 mole % of linking group (6) (as part of structure (1) or as part of component Q) based on the total moles of structures (2)–(6) in the composition, more preferably about 1–20 mole %, most preferably about 5–15 mole %. The lightly crosslinked polymers of the invention preferably contain about at least about 60 mole % of structure (2), more preferably about 65–95 mole %, most preferably about 85–90%; about 0–25 mole % of structure (3); more preferably about 1–10 mole %, about 0–25 mole % of structure (4), more preferably about 1–10 mole %; and about 0–25 mole % of structure (5), more preferably about 1–10 mole %. The lightly crosslinked polymers of the invention preferably contain about 25 mole % or less of other groups, more preferably about 10 mole % or less, most preferably about 5 mole % or less. In general, it is preferred to have a high aromatic content (as enabled by the invention) to obtain better etch resistance while maintaining the ability to develop (selectively dissolve) the radiation-exposed portions of the photoresist.

In addition to the lightly crosslinked polymers, the photoresist compositions of the invention contain a photosensitive acid generator (PAG). The invention is not limited to the use of any specific PAG or combination of PAG's, that is the benefits of the invention may be achieved using various photosensitive acid generators known in the art.

Examples of suitable photosensitive acid generators include onium salts such as triaryl sulfonium hexafluoroantimonate, diaryliodonium hexafluoroantimonate, hexafluoroarsenates, triflates (e.g. triphenylsulfonium triflate, bis (t-butyl phenyl) iodonium triflate), substituted aryl sulfonates such as pyrogallols (e.g. trimesylate of pyrogallol or tris(sulfonate) of pyrogallol), sulfonate esters of hydroxyimides, N-sulfonyloxynaphthalimides (N-camphorsulfonyloxynaphthalimide, N-pentafluorobenzenesulfonyloxynaphthalimide), α-α'bis-sulfonyl diazomethanes, sulfonate esters of nitro-substituted benzyl alcohols, naphthoquinone-4-diazides, alkyl disulfones and others.

The photoresist compositions of the invention will typically contain a solvent prior to their application to the desired substrate. The solvent may be any solvent conventionally used with acid-catalyzed photoresists which otherwise does not have any excessively adverse impact on the performance of the photoresist composition. Preferred solvents are propylene glycol monomethyl ether acetate, cyclohexanone, and ethyl cellosolve acetate.

The compositions of the invention may further contain minor amounts of auxiliary components such as dyes/sensitizers, base additives, etc. as are known in the art. Preferred base additives are weak bases which scavenge trace acids while not having an excessive impact on the performance of the photoresist. Preferred base additives are deactivated aromatic amines such as coumarin-1.

The photoresist compositions of the invention may further contain an amount of non-crosslinked acid-sensitive polymer (e.g., a conventional chemically amplified photoresist polymer). The proportion of non-crosslinked acid sensitive polymer is preferably less than about 50 wt. % based on the total weight of the lightly crosslinked polymer, more preferably less than about 25 wt. %.

The photoresist compositions of the invention preferably contain about 0.5–20 wt. % photosensitive acid generator based on the total weight of acid sensitive polymer in the composition. Where a solvent is present, the overall composition preferably contains about 50–90 wt. % solvent. The composition preferably contains about 1 wt. % or less of said base additive based on the total weight of acid sensitive polymer.

The invention is not limited to any specific method of synthesizing the lightly crosslinked polymers used. Preferably, the lightly crosslinked polymers are made by forming the acid labile crosslinking component (structure (6)) with bis-ethylenic unsaturation. If a suitable crosslinking component is commercially available, such component may be used as opposed to synthesizing the component from scratch.

Where the crosslinking component is an acid-labile bis acrylate, the composition may be formed by reacting methacryloyl chloride with 2,5-dimethyl-2,5-hexane diol and triethylamine in a chloroform medium. The reaction is preferably quenched with water followed by extraction with further chloroform. The resulting bis acrylate is preferably purified using techniques such as chromatography and/or washing.

The lightly crosslinked polymers of the invention are preferably formed by reacting the respective ethylenically unsaturated monomer precursors of structures (2)–(6) in the desired proportions in the presence of a radical initiator. The polymers of the invention preferably have a weight average molecular weight of about 10,000–100,000, more preferably about 20,000–80,000.

The photoresist compositions of the invention can be prepared by combining the lightly crosslinked polymer, PAG and any other desired ingredients using conventional methods. The photoresist composition to be used in photolithographic processes will generally have a significant amount of solvent.

The photoresist compositions of the invention are especially useful for photolithographic processes used in the manufacture of integrated circuits on semiconductor substrates. The compositions are especially useful for photolithographic processes using deep UV radiation (190–315 nm wavelength), especially 248 nm wavelength radiation. Where use of other radiation (e.g. mid-UV or e-beam) is desired, the compositions of the invention can be adjusted by the addition of an appropriate dye or sensitizer to the composition. The general use of the photoresist compositions of the invention in photolithography for semiconductors is described below.

Semiconductor photolithographic applications generally involve transfer of a pattern to a layer of material on the semiconductor substrate. The material layer of the semiconductor substrate may be a metal conductor layer, a ceramic insulator layer, a semiconductor layer or other material depending on the stage of the manufacture process and the desired material set for the end product. In many instances, an antireflective coating (ARC) is applied over the material layer before application of the photoresist layer. The ARC layer may be any conventional ARC which is compatible with acid catalyzed photoresists.

Typically, the solvent-containing photoresist composition is applied to the desired semiconductor substrate using spin coating or other technique. The substrate with the photoresist coating is then preferably heated (pre-exposure baked) to remove the solvent and improve the coherence of the photoresist layer. The thickness of the applied layer is preferably as thin as possible with the provisos that the thickness is preferably substantially uniform and that the photoresist layer be sufficient to withstand subsequent processing (typically reactive ion etching) to transfer the lithographic pattern to the underlying substrate material layer. The pre-exposure bake step is preferably conducted for about 10 seconds to 15 minutes, more preferably about 15 seconds to one minute. The pre-exposure bake temperature may vary depending on the glass transition temperature of the photoresist. Preferably, the pre-exposure bake is performed at temperatures which are at least 20° C. below $T_g$.

After solvent removal, the photoresist layer is then patternwise-exposed to the desired radiation (e.g. deep-UV or e-beam). Where scanning particle beams such as electron beam are used, patternwise exposure may be achieved by scanning the beam across the substrate and selectively applying the beam in the desired pattern. More typically, where wavelike radiation forms such as 248 nm ultraviolet radiation, the patternwise exposure is conducted through a mask which is placed over the photoresist layer. For deep UV radiation, the total exposure energy is preferably about 100 millijoules/cm$^2$ or less, more preferably about 50 millijoules/cm$^2$ or less.

After the desired patternwise exposure, the photoresist layer is typically baked to further complete the acid-catalyzed reaction and to enhance the contrast of the exposed pattern. The post-exposure bake is preferably conducted at about 100–175° C., more preferably about 125–160° C. The post-exposure bake is preferably conducted for about 30 seconds to 5 minutes.

After post-exposure bake, the photoresist structure with the desired pattern is obtained (developed) by contacting the photoresist layer with an alkaline solution which selectively dissolves the areas of the photoresist which were exposed to radiation. Preferred alkaline solutions (developers) are aqueous solutions of tetramethyl ammonium hydroxide. The resulting photoresist structure on the substrate is then typically dried to remove any remaining solvent. The photoresist compositions of the invention are generally characterized in that the product photoresist structures having high etch resistance. In some instances, it may be possible to further enhance the etch resistance of the photoresist structure by using a post-silylation technique using methods known in the art.

The pattern from the photoresist structure may then be transferred to the material (e.g., ceramic, metal or semiconductor) of the underlying substrate. Typically, the transfer is achieved by reactive ion etching or some other etching technique. In the context of reactive ion etching, the etch resistance of the photoresist layer is especially important. Thus, the compositions of the invention and resulting photoresist structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices.

The processes for making these (ceramic, metal or semiconductor) features generally involve providing a material layer or section of the substrate to be patterned, applying a layer of photoresist over the material layer or section, patternwise exposing the photoresist to radiation, developing the pattern by contacting the exposed photoresist with a solvent, etching the layer(s) underlying the photoresist layer at spaces in the pattern whereby a patterned material layer or substrate section is formed, and removing any remaining photoresist from the substrate. In some instances, a hard mask may be used below the photoresist layer to facilitate transfer of the pattern to a further underlying material layer or section. Examples of such processes are disclosed in U.S. Pat. Nos. 4,855,017; 5,362,663; 5,429,710; 5,562,801; 5,618,751; 5,744,376; 5,801,094; and 5,821,469, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithography technique or device structure.

EXAMPLE 1

4.46 g (0.0156 mol) of 2,5-bis(methacryloyloxy)-2,5-dimethylhexane, 1.11 g (0.0067 mol) of azobisisobutyinitrile and 120 g of acetonitrile were added to a solution containing 51.75 g of diethylene glycol and 23.25 g (0.193 mol) of 4-hydroxystyrene at room temperature under nitrogen. The reaction mixture was heated to 82° C. for 14 hours to carry out free-radical polymerization. After the completion of polymerization, the reaction mixture was cooled to room temperature, precipitated into water (3 L), stirred for one hour and filtered. The filtered polymer was dried. The dried polymer was then suspended in 300 ml of methylene chloride for two hours at room temperature with stirring. The polymer was then recovered by filtering the suspension and drying the polymer at 40° C. for 24 hours.

The resulting lightly crosslinked polymer was soluble in propylene glycol monomethyl ether acetate and in ethyl lactate. The polymer was analyzed by NMR and GPC which indicated that the polymer had a combination of hydroxystyrene groups and acid-labile bis-acrylate crosslinking. The polymer had a weight average molecular weight of 49,000 and a polydispersity of 5.12.

A film of the polymer was tested for solubility in 0.14 N tetramethyl ammonium hydroxide (TMAH) aqueous alkaline developer solution. The polymer had a dissolution rate of 34 Å/sec.

EXAMPLE 2

The photolithographic performance of the polymer of Example 1 was tested from the following photoresist formulation in parts by weight:

| | |
|---|---|
| Propylene glycol monomethyl ether acetate | 82 |
| Polymer of Example 1 | 16.74 |
| Di-t-butylphenyliodonium perfluorooctanesulfonate | 1.26 |
| Tetramethyl ammonium hydroxide | 0.036 |

The photoresist formulation was spin coated onto silicon wafers for 30 seconds followed by soft baking at 130° C. for 60 seconds on a vacuum hot plate to produce film of about 0.6 microns ($\mu$m) thickness. The wafers were then exposed to 248 nm radiation (18 mJ/cm$^2$ dose) in a GCA 0.53 NA excimer laser stepper. The exposure pattern was an array of lines and spaces of varying dimensions down to 0.15 $\mu$m. The exposed wafers were post-exposure baked on a vacuum hot plate at 130° C. for 90 seconds. The pattern was then developed by contacting the wafers with a 0.263N TMAH developer for 60 seconds. The resulting pattern was then examined by scanning electron microscopy (SEM). Line-space pairs of 0.25 $\mu$m and 0.20 $\mu$m were well resolved with clean profiles.

The relative shrinkage of the photoresist formulation was determined by measurement of the thickness change for similarly coated wafers which were blanket exposed to 248 nm radiation and post-exposure baked. The above photoresist formulation had reduced shrinkage compared to similar formulations based on a conventional hydroxystyrene/t-butyl acrylate (65/35 mol ratio) copolymer.

The etch resistance of the photoresist formulation was determined using similarly coated wafers which were blanket exposed to 248 nm radiation and post-exposure baked. The wafers were subjected to a conventional etching protocol for ARC (antireflective coating) opening and oxide layer etching. The above photoresist formulation had significantly improved etch resistance (as measured by the thickness of the remaining film) compared to similar formulations based on the conventional hydroxystyrene/t-butyl acrylate (65/35 mol ratio) copolymer.

EXAMPLE 3

7.77 g (0.027 mol) of 2,5-bis(methacryloyloxy)-2,5-dimethylhexane, 1.17 g (0.009 mol) t-butyl acrylate, 1.11 g (0.0067 mol) of azobisisobutylnitrile and 120 g of acetonitrile were added to a solution containing 51.75 g of diethylene glycol and 23.25 g (0.193 mol) of 4-hydroxystyrene at room temperature under nitrogen. The reaction mixture was heated to 82° C. for 14 hours to carry out free-radical polymerization. After the completion of polymerization, the reaction mixture was cooled to room temperature, precipitated into water (3 L), stirred for one hour and filtered. The filtered polymer was dried. The dried polymer was then suspended in 300 ml of methylene chloride for two hours at room temperature with stirring. The polymer was then recovered by filtering the suspension and drying the polymer at 40° C. for 24 hours.

The resulting lightly crosslinked polymer was soluble in propylene glycol monomethyl ether acetate and in ethyl lactate. The polymer was analyzed by NMR and GPC which indicated that the polymer had a combination of hydroxystyrene groups, t-butyl acrylate groups and acid-labile bis-acrylate crosslinking. The polymer had a weight average molecular weight of 61,000 and a polydispersity of 6.06.

A film of the polymer was tested for solubility in 0.263 N tetramethyl ammonium hydroxide (TMAH) aqueous alkaline developer solution. The polymer had a dissolution rate of 16 Å/sec.

EXAMPLE 4

The photolithographic performance of the polymer of Example 3 was tested from the following photoresist formulation in parts by weight:

| | |
|---|---|
| Propylene glycol monomethyl ether acetate | 82 |
| Polymer of Example 3 | 16.92 |
| Di-t-butylphenyliodonium perfluorooctanesulfonate | 1.08 |
| Tetramethyl ammonium hydroxide | 0.036 |

The photoresist formulation was spin coated onto silicon wafers, pattern-wise exposed, and developed in the same manner as in Example 2. The resulting pattern was then examined by scanning electron microscopy (SEM). Line-space pairs of 0.25 $\mu$m were well resolved with clean profiles.

The relative shrinkage and the etch resistance of the photoresist formulation were determined as in Example 2 above. The photoresist formulation of had reduced shrinkage and increased etch resistance compared to similar formulations based on a conventional hydroxystyrene/t-butyl acrylate (65/35 mol ratio) copolymer.

What is claimed is:

1. A photo resist composition comprising (a) a lightly crosslinked polymer containing polar-functionalized aromatic pendant groups and having acid-labile crosslinks, and (b) a photosensitive acid generator, said lightly crosslinked polymer containing the structure:

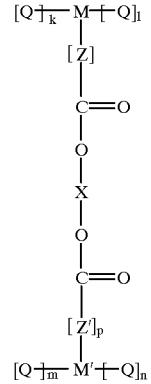

wherein:
  (i) k, l, m, and n are independently equal to 0 or 1, except that (k+l)≧1 and (m+n)≧1,
  (ii) X is a component that forms at least one acid-cleavable bond with an oxygen of a neighboring carboxyl moiety, (iii) M and M' are moieties independently selected from the group consisting of an ethylene backbone moiety, a cycloalkyl moiety, and a polycyclic alkyl moiety,
(iv) Z and Z' are moieties independently selected from the group consisting of phenyl and cycloalkyl,
(v) p and q are independently equal to 0 or 1,
(vi) Q is a polymeric structure containing units having the structure:

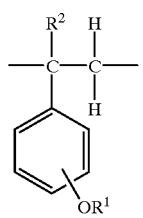

(vii) $R^1$ is an alkaline-soluble polar group, and
(viii) $R^2$ is hydrogen or an alkyl group.

2. The composition of claim 1 wherein said structures Q are not identical.
3. The composition of claim 1 wherein k, l, m, and n each equal 1.
4. The composition of claim 1 wherein $OR^1$ is in the para position.
5. The composition of claim 1 wherein each structure Q further contains structures selected from the group consisting of

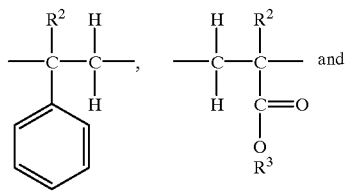 and

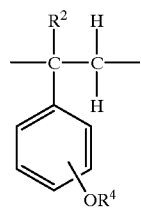

wherein $R^2$ is hydrogen or an alkyl group, and $R^3$ and $R^4$ are independently selected from the group consisting of primary alkyl, secondary alkyl, tertiary alkyl, alicyclic, heterocyclic and heteroaromatic moieties.

6. The composition of claim 1 further comprising (c) a solvent for (a) and (b).
7. The composition of claim 1 wherein said polymer comprises non-crosslinked acid-labile pendant groups.
8. The composition of claim 1 wherein at least a portion of said polar-functionalized aromatic pendant groups contain hydroxyl polar groups.
9. The composition of claim 1 wherein at least a portion of said polar-functionalized aromatic pendant groups contain non-acidic and non-hydroxylic polar groups.
10. The composition of claim 1 wherein at least two of said O—X bonds are acid labile.
11. The composition of claim 1 wherein X comprises two ester groups bonded to each other.
12. The composition of claim 1 wherein X comprises a ketal.
13. The composition of claim 1 wherein X comprises an acetal.
14. The composition of claim 1 wherein said composition further comprises a sensitizer to promote the photosensitivity of the photosensitive acid generator on exposure to radiation.
15. The composition of claim 5 wherein $R^3$ is selected from the group consisting of tertiary alkyl and heterocyclic non-aromatic oxygen-containing rings.
16. The composition of claim 1 wherein said polar group $R^1$ is hydrogen or carboxyl.
17. A photoresist composition comprising (a) a lightly crosslinked polymer containing polar-functionalized aromatic pendant groups and having acid-labile crosslinks, and (b) a photosensitive acid generator, said lightly crosslinked polymer containing the structure:

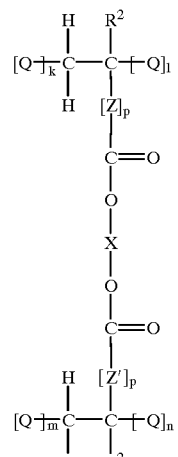

wherein:
(i) k, l, m, and n are independently equal to 0 or 1, except that $(k+l) \geq 1$ and $(m+n) \geq 1$,
(ii) Q is a polymeric structure containing units having the structure:

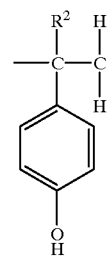

(iii) $R^2$ is either hydrogen or an alkyl group,
(iv) X is

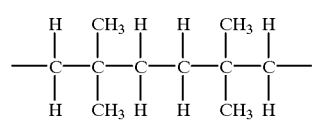

(v) Z and Z' are moieties independently selected from the group consisting of phenyl and cycloalkyl, and
(vi) p and q are independently equal to 0 or 1.

* * * * *